United States Patent [19]
Yamazaki et al.

[11] Patent Number: 5,134,081
[45] Date of Patent: Jul. 28, 1992

[54] IMAGE SENSOR FREE FROM UNDESIRABLE INCIDENT LIGHT RAYS AND A MANUFACTURING METHOD FOR THE SAME

[75] Inventors: Shunpei Yamazaki, Tokyo; Takehsi Fukada, Ebina, both of Japan

[73] Assignee: Semiconductor Energy Laboratory Co., Ltd., Kanagawa, Japan

[21] Appl. No.: 544,619

[22] Filed: Jun. 27, 1990

Related U.S. Application Data

[62] Division of Ser. No. 301,335, Jan. 25, 1989, Pat. No. 4,970,382.

[30] Foreign Application Priority Data

Jan. 27, 1988 [JP] Japan ................................. 63-18144

[51] Int. Cl.⁵ ........................................... H01L 31/18
[52] U.S. Cl. ........................................... 437/2; 437/3; 437/40; 437/41; 437/42
[58] Field of Search ................................. 430/320, 321; 250/211 J, 208.1; 358/482, 483, 496; 437/2, 3, 40, 41, 42, 173, 181

[56] References Cited

U.S. PATENT DOCUMENTS

| | | | |
|---|---|---|---|
| 4,728,997 | 3/1988 | Szydlo et al. | 357/2 |
| 4,943,710 | 7/1990 | Sakama et al. | 250/208.1 |
| 4,959,533 | 9/1990 | Yamazaki et al. | 250/208.1 |
| 5,017,502 | 5/1991 | Sakama et al. | 437/2 |

*Primary Examiner*—Marion E. McCamish
*Assistant Examiner*—Janis L. Dote
*Attorney, Agent, or Firm*—Sixbey, Friedman, Leedom & Ferguson

[57] ABSTRACT

An improved image sensor is described. The image sensor is produced with a light window by removing a portion of a photosensitive laminate structure by projection of a laser beam. The laminate structure comprises a light blocking electrode, a semiconductor film and an opposed electrode formed on a transparent substrate in this order. Because of differences in laser scribing effectiveness at different depths, the laminate structure is partially removed in a somewhat conical form and therefore the light blocking electrode extends beyond the semiconductor film.

6 Claims, 4 Drawing Sheets

F I G. 2A
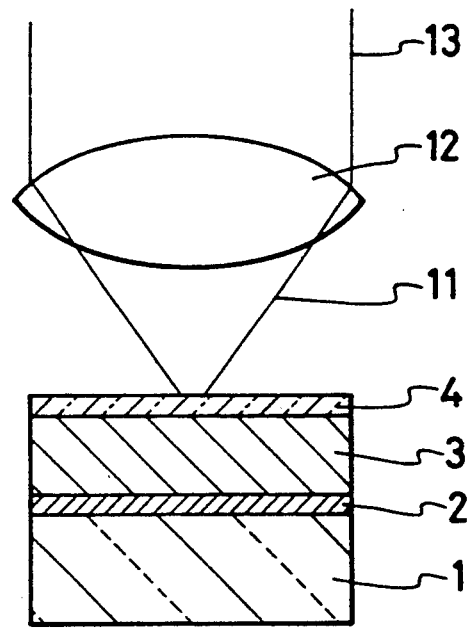
F I G. 2B
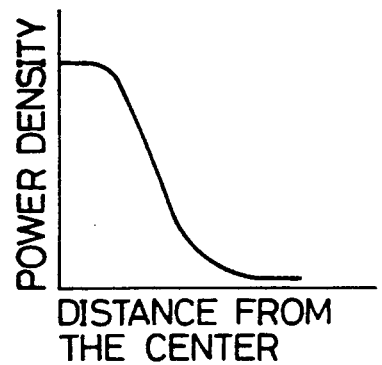
F I G. 2C
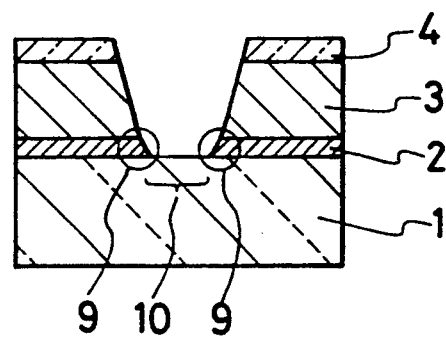

IMAGE SENSOR FREE FROM UNDESIRABLE INCIDENT LIGHT RAYS AND A MANUFACTURING METHOD FOR THE SAME

This is a divisional application of Ser. No. 07/301,335, filed Jan. 25, 1989, now U.S. Pat. No. 4,970,382.

BACKGROUND OF THE INVENTION

The present invention relates to an image sensor free from undesirable incident light rays which have not been reflected in the surface bearing the image to be sensed and a method of manufacturing the same.

Along with the efforts to decrease the sizes of facsimile machines, photo-copying machines and the like, contact image sensors, as a very small photoelectric conversion sensor, have attracted interest of the researchers.

An exemplary conventional image sensor is illustrated in FIG. 1(A). The sensor comprises a glass substrate 1, a front light blocking electrode 2, a photosensitive semicoductor film 3a, a rear transparent electrode 4, a lead electrode 5 for taking out output singnals and a transparent protector layer 6 which is to make direct contact with an original 7. A light window 10 is opened in the photoelectric conversion structure consisting of the electrodes 2 and 3 and the semiconductor film 5. Light rays 8 passed through the light window 10 are reflected by the original 7 and absorbed by the semiconductor film 3a with the visual information contained in the original 6. Another exemplary image sensor is illustrated in FIG. 1(B). This sensor comprises similar elements as the above example except that the lead electrode 5 extends over the upper surface of the photosensitive semiconductor film 3b and divided into two parts between which photogenerated signals are produced. A light window is opened in the lead electrode 5 in order to provide an access to the semiconductor film 3b. In these structure, the light blocking electrodes 2 have to be formed extending beyond the semiconductor films 3a or 3b at 9. The extending portion 9 is provided for preventing incident light from directly entering the semiconductor film without reflection on the original 7.

The photoelectric conversion structures are formed by patterning the triple-layered laminae consisting of the electrodes 2 and 4 and the semiconductor film 3. Particularly, due to the extending portion 9, the light blocking electrode 2 cannot be patterned together with the semiconductor film. This increases the number of process steps.

SUMMARY OF THE INVENTION

It is an object of the present invention to provide an image sensor capable of operating without sensing error and a method for manufacturing the same.

It is another object of the present invention to provide a method for producing image sensors with a decreased number of process steps and consequently a low production cost is realized.

BRIEF DESCRIPTION OF THE DRAWINGS

FIG. 2(A) is a schematic diagram showing a manufacturing method of image sensors in accordance with the present invention.

FIG. 2(B) is a graphical diagram showing the power density profile of a laser beam.

FIG. 2(C) is a cross sectional view showing a configuration of an image sensor in accordance with the present invention.

DETAILED DESCRIPTION OF THE PREFERRED EMBODIMENTS

Figure 1A:
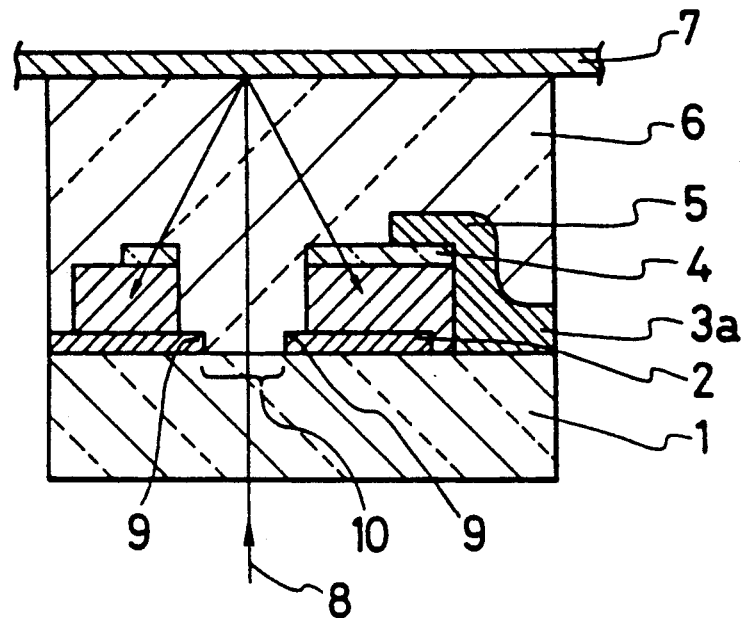
FIGS. 1(A) and 1(B) are cross sectional views showing prior art image sensors.
Figure 1B:
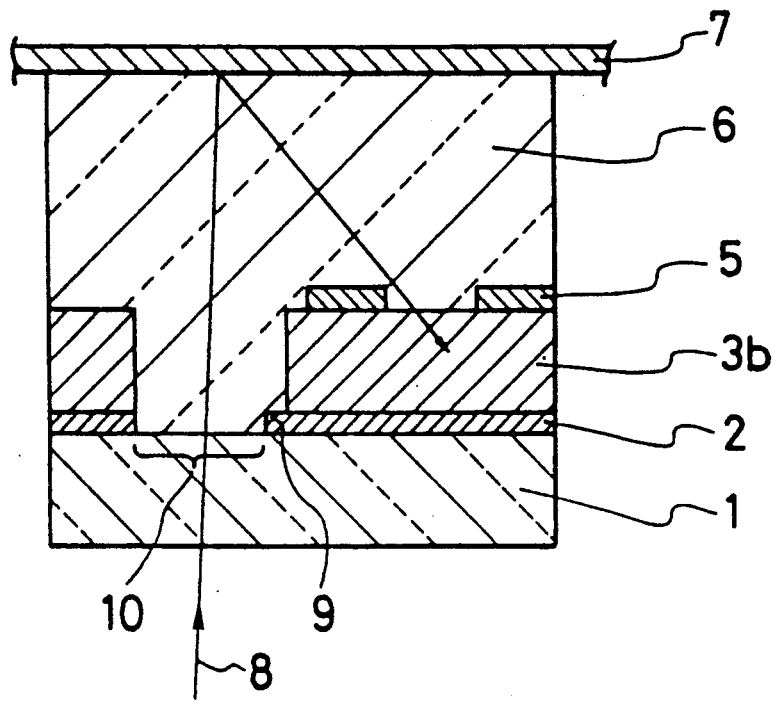

Referring now to FIGS. 2(A) to 2(C), a method of manufacturing gap-less type image sensors is explained in accordance with the present invention is illustrated. The sensor is produced by effecting laser scribing on the laminate structure on a glass substrate 1 (Corning #7059) comprising a light blocking electrode 2 formed of an opaque conductive material such as cromium by sputtering to a thickness of 500 Å, a photosensitive amorphous silicon semiconductor film 3 comprising a PIN junction, a transparent electrode 4 formed of ITO by sputterning to a thickness of 1000 Å. The silicon semiconductor film 3 consists of a 500 Å thick N-type film, a 1 micron thick intrinsic film and a 200 Å P-type thick film formed respectively in this order.

An opening have to be opened through the laminate structure in order to provide a light window. The opening is formed by projecting laser rays 11 which are emitted from YAG laser and focussed by a lens 12. The wavelength of the laser rays is 1.06 microns. The energy profile of the laser rays is illustrated in FIG. 2(B). From this profile, it is understood that the the opening is formed in the laminate structure with sloped edges as in FIG. 2(C). The width of the light window is 50 microns for example. The wave length of the laser ray may be 0.53 micron, or 0.248 micron (when an excimer laser is used).

Figure 3:
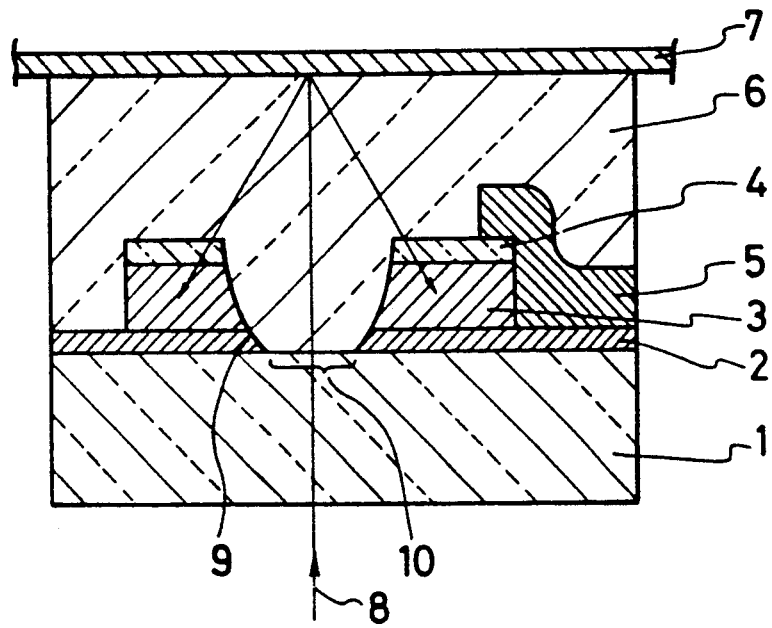
FIGS. 3, 4, 5(A) and 5(B) are cross sectional views showing other image sensors in accordance with the present invention.

A lead 5 of Al, Cu or Ag is formed and patterned by photolithgraphy as illustrated in FIG. 3. Alternatively, the lead may be a known screening technique. The formation of the lead may be carried out in advance of the laser scribing. A polyimide film 6 is formed by a known spinning method to a thickness of 10 microns.

Figure 4:
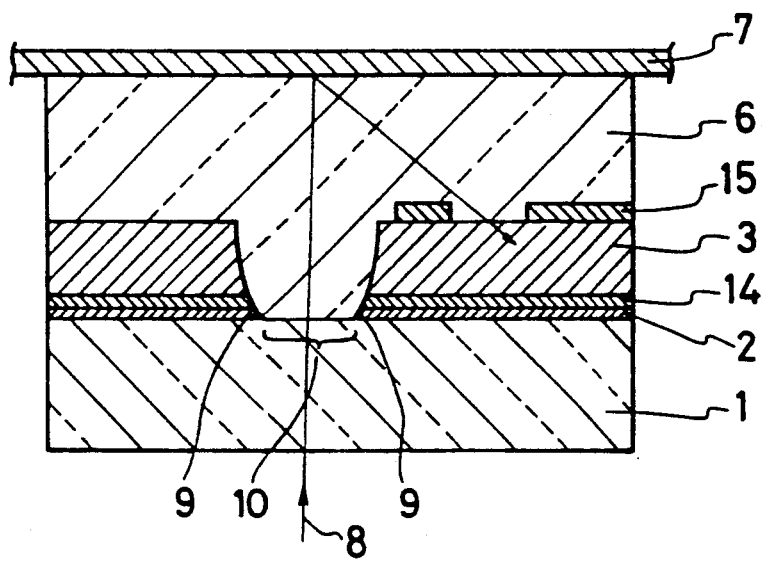

FIG. 4 shows a planar type image sensor produced in the same manner. A Cr film is deposited to a thickness of 500 Å by a known plama CVD. Further, a SiN film of 1000 Å is deposited on the Cr film. In place of this dual film, other light blocking films such as TiN films may be used. On the SiN film 14, an amorphous silicon intrinsic semiconductor film is deposited to a thickness of 1 micron. Furthermore, an n+ type amorphous silicon semiconductor film is deposited to a thickness of 1 micron, followed by sputtering an Al electrode 15 of 1 micron thickness, in order to make ohmic contant with the overlying Al electrode 15. Al may be replaced by Cr, Cu, Ti, Mo, ITO, $SnO_2$. The Al film 15 and the underlying n+ type film are patterned by a known photolithography. Other production conditions are same as those for the previous embodiments.

Figure 5A:
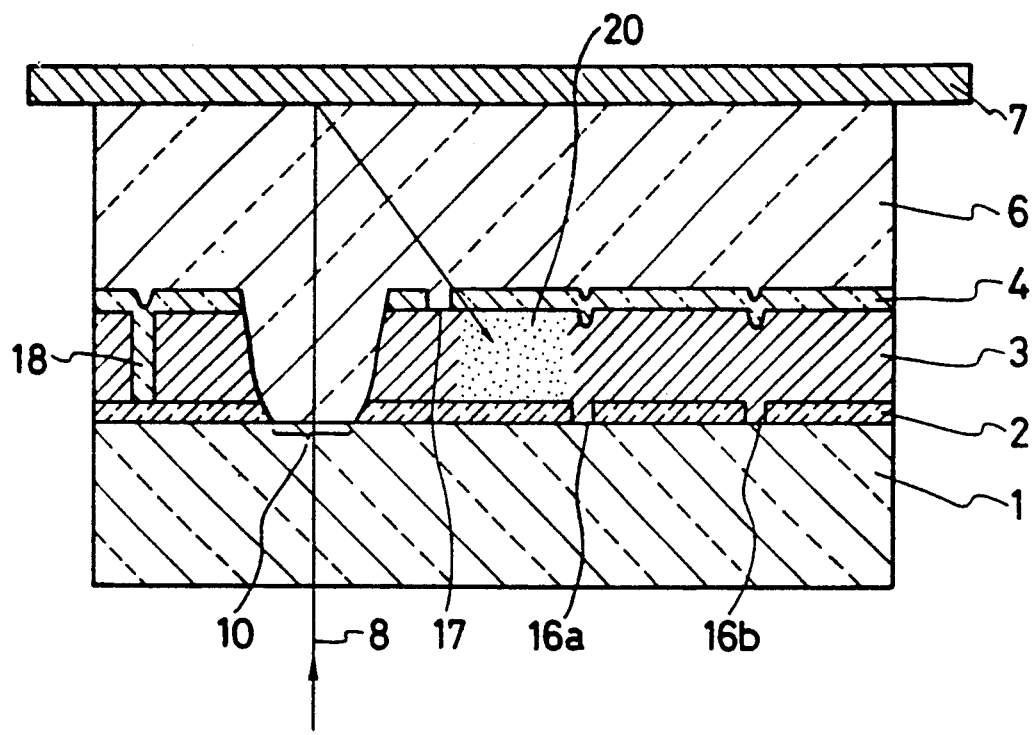
Figure 5B:
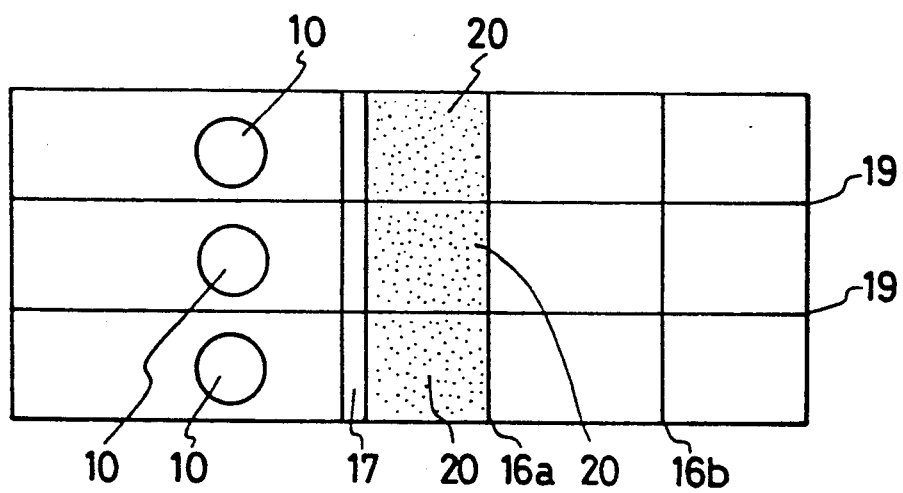

Referring to FIGS. 5(A) and 5(B), a one-dimmensional line sensor is illustrated. The structure in FIG. 5(A) is substantially same as that described in FIG. 3. FIG. 5(B) is a plane view showing the planar configuration of the sensor. Although only three dot elements are illustrated in the figure, a large number of light window 10 are arranged in a line in reality. Grooves 16a and 16b are formed in the light blocking electrode 2 by laser scribing using a 248 nm excimer laser. Also, grooves 19 are engraved by the excimer laser throughout the electrodes 2 and 4 and the intervening semiconductor film 3. The grooves 17 and 16a define the sensing area 20 of the semiconductor film 3.

While several embodiments have been specifically described, it is to be appreciated that the present invention is not limited to the particular examples described and that modifications and variations can be made without departure from the scope of the invention as defined by the append claims. For example, although the examples are constructed with the light blocking electrodes made of cromium, TiN, Al, Mo, Ti or Cu film may be used, or composite electrodes may be used, such as Cr/Al, Cr/Mo, Cr/Ti, Cr/Cu/Cr or a laminate film consisting of an ITO film and a Mo film. The electrode is formed by press printing. Also, the transparent electrode 4 may be formed of a metal thin film having a sufficiently decreased thickness which allows the transmission of incident light. The metal of the transparent electrode 4 is, for example, Cr, Al, Cu, Au, Mo, Ti or the like.

Instead of the PIN amorphous silicon semiconductor film, other types of photosensitive semiconductor film may be used such as those of NI type, IN type, PI type or IP type, or those made from SiC, SiN, SiGe or hetero junctions between them. Also, poly- or micro-crystalline structure may be used.

We claim:

1. A method for producing image sensors comprising the steps of:

forming a light blocking electrode on a transparent substrate;
   forming a photosensitive semiconductor layer on said light blocking electrode;
   forming a transparent electrode on said photosensitive semiconductor layer; and
   forming a light window on a portion of said substrate through said transparent electrode, photosensitive semiconductor layer and light blocking electrode by removing the above laminar structure on said portion by the use of laser scribing,
   wherein said light window has sloped side surfaces in order that said light blocking electrode extends beyond said semiconductor layer to block undesired incident light rays to said semiconductor layer.

2. The method of claim 1 wherein said laser scribing is implemented by a YAG laser.

3. The method of claim 1 wherein said laser scribing is implemented by an excimer laser.

4. The method of claim 1 wherein said light blocking electrode comprises a material selected from the group consisting of Cr, TiN, Al, Mo, Ti, Cu, and compounds thereof.

5. The method of claim 1 wherein said photosensitive semiconductor layer comprises an amorphous silicon semiconductor.

6. The method of claim 5 wherein said photosensitive semiconductor layer includes PIN, NI, IN, PI or IP junction.

* * * * *